United States Patent
Tsumura

(10) Patent No.: US 9,806,605 B2
(45) Date of Patent: Oct. 31, 2017

(54) VOLTAGE DIVIDER CIRCUIT HAVING AT LEAST TWO KINDS OF UNIT RESISTORS

(71) Applicant: SEIKO INSTRUMENTS INC., Chiba-shi, Chiba (JP)

(72) Inventor: Kazuhiro Tsumura, Chiba (JP)

(73) Assignee: STI Semiconductor Corporation (JP)

( * ) Notice: Subject to any disclaimer, the term of this patent is extended or adjusted under 35 U.S.C. 154(b) by 233 days.

(21) Appl. No.: 14/426,209

(22) PCT Filed: Aug. 13, 2013

(86) PCT No.: PCT/JP2013/071885
§ 371 (c)(1),
(2) Date: Mar. 5, 2015

(87) PCT Pub. No.: WO2014/041950
PCT Pub. Date: Mar. 20, 2014

(65) Prior Publication Data
US 2015/0214836 A1 Jul. 30, 2015

(30) Foreign Application Priority Data
Sep. 14, 2012 (JP) ................. 2012-202982

(51) Int. Cl.
H03H 7/24 (2006.01)
H02M 3/06 (2006.01)
H01C 13/02 (2006.01)
H01L 27/08 (2006.01)

(52) U.S. Cl.
CPC .............. *H02M 3/06* (2013.01); *H01C 13/02* (2013.01); *H01L 27/0802* (2013.01); *H03H 7/24* (2013.01)

(58) Field of Classification Search
CPC .......... H02M 3/06; H01C 13/02; H03H 7/24; H01L 27/0802
See application file for complete search history.

(56) References Cited

U.S. PATENT DOCUMENTS 5,905,427 A    5/1999  Hamasaki et al. ............ 338/320
6,013,940 A *  1/2000  Harada .............. H01L 27/0629
                                                    257/536

(Continued)

FOREIGN PATENT DOCUMENTS

EP    0698923    2/1996
JP    3787591    6/2006

(Continued)

OTHER PUBLICATIONS

English Translation of International Search Report dated Nov. 19, 2013 issued in International Appln. No. PCT/JP2013-071885.

(Continued)

*Primary Examiner* — Emily P Pham
(74) *Attorney, Agent, or Firm* — Adams & Wilks

(57) ABSTRACT

Provided is a voltage divider circuit having a small area and good accuracy of a division ratio. Among a plurality of resistors of the voltage divider circuit, each of resistors having a large resistance value, that is, resistors (1/4R, 1/2R, 1R, 9R, 10R) having high required accuracy of ratio includes first unit resistors (5A) that have a first resistance value and are connected in series or connected in parallel to each other, and each of resistors having a small resistance value, that is, resistors (1/16R, 1/8R) having low required accuracy of ratio includes second unit resistors (5B) that have a second resistance value smaller than the first resistance value and are connected in parallel to each other.

20 Claims, 9 Drawing Sheets

(56) References Cited

U.S. PATENT DOCUMENTS

| | | | |
|---|---|---|---|
| 6,060,760 A * | 5/2000 | Tan | H01L 27/0802 257/536 |
| 6,650,173 B1 | 11/2003 | Khouri et al. | 327/538 |
| 6,725,436 B2 * | 4/2004 | Koike | H01L 27/0802 257/E27.047 |
| 6,904,583 B2 * | 6/2005 | Hirohata | H01L 27/0802 257/E27.047 |
| 7,053,751 B2 * | 5/2006 | Itoh | H01L 27/0802 257/E27.047 |
| 2003/0154456 A1 | 8/2003 | Koike et al. | 716/8 |
| 2006/0119666 A1 * | 6/2006 | Yokoyama | B41J 2/3351 347/59 |
| 2009/0039955 A1 | 2/2009 | Hosoya | 327/553 |
| 2009/0212749 A1 | 8/2009 | Goto | 323/233 |
| 2009/0295462 A1 * | 12/2009 | Itoh | G05F 1/56 327/525 |
| 2012/0181995 A1 | 7/2012 | Chu | 323/271 |

FOREIGN PATENT DOCUMENTS

| | | |
|---|---|---|
| JP | 4175862 | 11/2008 |
| WO | 2007099980 | 9/2007 |

OTHER PUBLICATIONS

European Search Report dated May 17, 2016 issued in Application No. EP 13 83 7239.

* cited by examiner

|  |  |  | Ex. 1 | Ex. 2 | Ex. 3 | Ex. 4 | Ex. 5 |
|---|---|---|---|---|---|---|---|
| Upper side | A-B | 1/16R | 0.0625 | Short | 0.0625 | 0.0625 | Short |
|  | B-C | 1/8R | 0.125 | 0.125 | Short | Short | Short |
|  | C-D | 1/4R | 0.25 | 025 | 0.25 | Short | Short |
|  | D-E | 1/2R | 0.5 | 0.5 | Short | Short | Short |
|  | E-F | 1R | 1 | 1 | Short | Short | Short |
|  | F-G | 9R | 9 | 9 | 9 | 9 | 9 |
|  | Upper side sum |  | 10.9375 | 10.875 | 9.3125 | 9.0625 | 9 |
| Lower side | G-H | 10R | 10 | 10 | 10 | 10 | 10 |
| Upper side to lower side ratio |  |  | 1.094 | 1.088 | 0.931 | 0.906 | 0.900 |
| Deviation |  |  | 9.4% | 8.7% | -6.9% | -9.4% | -10.0% |

FIG. 7
PRIOR ART

|  |  | Resistance ratio to GH | Required accuracy of ratio |
|---|---|---|---|
| Upper side | A-B | 1/16R | 0.63% | 32.0% |
| | B-C | 1/8R | 1.25% | 16.0% |
| | C-D | 1/4R | 2.50% | 8.00% |
| | D-E | 1/2R | 5.00% | 4.00% |
| | E-F | 1R | 10.0% | 2.00% |
| | F-G | 9R | 90.0% | 0.222% |
| Lower side | G-H | 10R | 100% | 0.200% |

VOLTAGE DIVIDER CIRCUIT HAVING AT LEAST TWO KINDS OF UNIT RESISTORS

TECHNICAL FIELD

The present invention relates to a voltage divider circuit.

BACKGROUND ART

First, as an application example of a voltage divider circuit, a case is described with reference to FIG. 1, in which a constant voltage output circuit, which uses a voltage divider circuit including resistors, is manufactured on a semiconductor wafer.

As illustrated in FIG. 1, the constant voltage output circuit includes a reference voltage generating circuit, an amplifier, the voltage divider circuit, and an output transistor. The constant voltage output circuit supplies a constant output voltage. An example of the voltage divider circuit used herein is illustrated in FIG. 2. Trimming fuses 2 are arranged in parallel to resistors 1 connected in series. When the fuse 2 is cut, a current flows through the resistor arranged in parallel thereto, thereby changing a division ratio of the voltage divider circuit. In this manner, an adjustment can be made to obtain a desired voltage.

The constant voltage output circuit is manufactured through a semiconductor wafer process, and varies in manufacturing. Thus, if no measure is taken, a reference voltage for determining a magnitude of a low voltage output varies. Thus, after the voltage divider circuit is manufactured, the division ratio of the voltage divider circuit is precisely adjusted depending on the variation of the reference voltage to adjust the reference voltage. With this, an output voltage of the constant voltage output circuit can be set substantially constant.

In particular, in recent years, higher accuracy of ±1% or ±0.5% has been demanded for the output voltage supplied from the constant voltage output circuit. By this reason, in Patent Literature 1, as illustrated in FIG. 3, a coarse adjustment circuit is trimmed, and an output voltage is measured thereafter so that a fine adjustment circuit is trimmed in accordance with the measured value. In this way, high accuracy of an output voltage of a constant voltage output circuit is achieved. Further, in Patent Literature 2, as illustrated in FIG. 4, trimming resistors 1R, 3R, and 4R are sequentially arranged around a reference resistor Rref, thereby suppressing a manufacturing variation to be small.

CITATION LIST

Patent Literature

[PTL 1] JP 4175862 B2
[PTL 2] JP 3787591 B2

SUMMARY OF INVENTION

Technical Problem

However, the method of Patent Literature 1 includes two trimming processes, namely, the coarse adjustment and the fine adjustment and a longer time is accordingly required for the manufacturing, with the result that the manufacturing cost is increased. Further, it is considered that improving the accuracy to reach a level that has been demanded in recent years is difficult to achieve by the method of Patent Literature 2.

In this case, two kinds of accuracy are required for the voltage divider circuit.

First, first accuracy is how finely a division ratio of the voltage divider circuit can be controlled. For example, in a case where an error of an output voltage of a constant voltage output circuit is ±1% or ±0.5%, the division ratio of the voltage divider circuit needs to change in steps of a value finer than this value. In a case where the division ratio of the voltage divider circuit is 1,000Ω:1,000Ω, that is, 1:1 and the division ratio is adjusted within the error of 1%, a plurality of 10Ω resistors connected in series and fuses connected in parallel to the resistors are needed.

Next, second accuracy is a matching degree of a division ratio supposed to be achieved through fuse trimming and an actually achieved division ratio. The matching degree is hereinafter referred to as "accuracy of division ratio". The accuracy of the division ratio depends on a manufacturing variation of a semiconductor wafer process. In order to suppress the influence of the manufacturing variation, the voltage divider circuit includes resistors having the same size. The resistors having the same size are referred to as "unit resistor". For example, a voltage divider circuit having a division ratio of 1:2 includes one unit resistor and two unit resistors connected in series. The accuracy of the division ratio of the voltage divider circuit depends on a relative ratio of resistance values of the unit resistors.

Polycrystalline polysilicon resistors are often used for forming the voltage divider circuit. Polycrystalline polysilicon has a grain boundary and its crystallinity thus locally varies. Further, when ions are implanted, the distribution of impurities locally varies. Consequently, when the area of the resistor is small, the influence of the local variation is remarkable to deteriorate the relative ratio of the resistance values of the unit resistors. In contrast, when the area of the resistor is large, the influence of the local variation is lessened to improve the relative ratio of the resistance values of the unit resistors. In this case, the poor relative ratio means that the ratio of the resistance values of the unit resistors deviates from an optimal value of 1:1. Because of such situation, the accuracy of the division ratio is generally deteriorated when the size of the unit resistor is reduced to downsize the voltage divider circuit.

In recent years, miniaturization of a semiconductor integrated circuit has been advanced due to price competition. However, when the semiconductor integrated circuit is miniaturized as it is, the area of the resistor of the voltage divider circuit is reduced, and the influence of the local variation is increased, with the result that the accuracy of the division ratio is deteriorated. When the area of the resistor of the voltage divider circuit is increased to deal with the deterioration, the accuracy of the division ratio is improved but the manufacturing cost is increased.

The present invention has been made in view of the above-mentioned problem, and provides a voltage divider circuit exhibiting good accuracy of a division ratio even when the area thereof is small.

Solution to Problem

In order to solve the above-mentioned problem, according to one embodiment of the present invention, there is provided a voltage divider circuit, including: a plurality of resistors; and a plurality of short circuit control elements that are respectively arranged correspondingly to the plurality of resistors, and are configured to respectively control short circuits of the plurality of resistors. Among the plurality of resistors, a resistor having a large resistance value includes first unit resistors that have a first resistance value and are connected in series or connected in parallel to each other, and a resistor having a small resistance value includes second unit resistors that have a second resistance value and are connected in parallel to each other. The second resistance value is smaller than the first resistance value.

Advantageous Effects of Invention

According to the one embodiment of the present invention, the voltage divider circuit having the small area and the good accuracy can be obtained.

BRIEF DESCRIPTION OF DRAWINGS

FIG. 6 is a table showing a division ratio of the voltage divider circuit illustrated in FIG. 5.
FIG. 7 is a table showing required accuracy of ratio for resistors forming the voltage divider circuit illustrated in FIG. 5.

DESCRIPTION OF EMBODIMENTS

Now, embodiments of the present invention are described with reference to the drawings.

Figure 1:
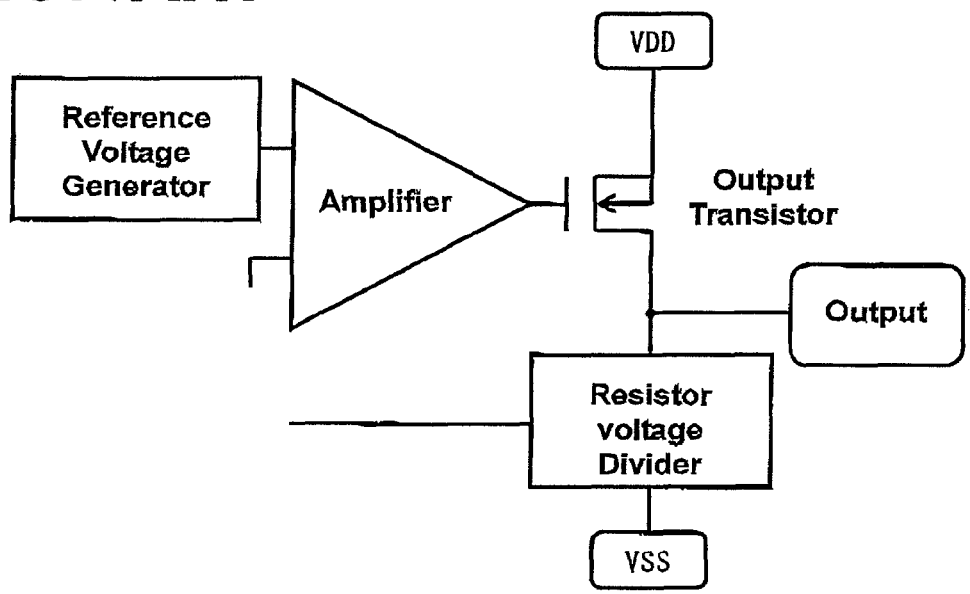
FIG. 1 is a diagram illustrating a constant voltage output circuit.
Figure 2:
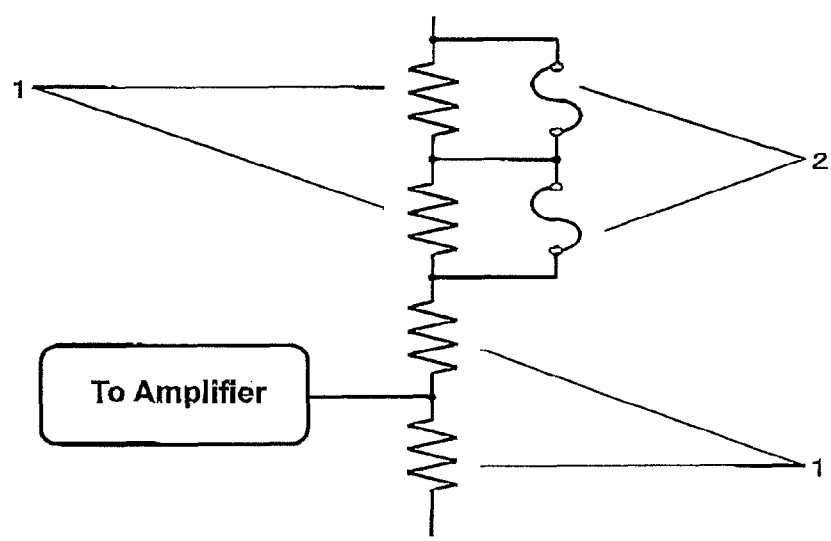
FIG. 2 is a schematic diagram illustrating a voltage divider circuit.
Figure 3:
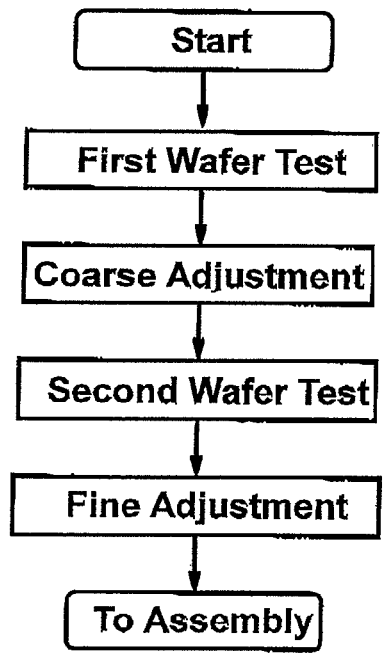
FIG. 3 is a diagram of Patent Literature 1.
Figure 4:
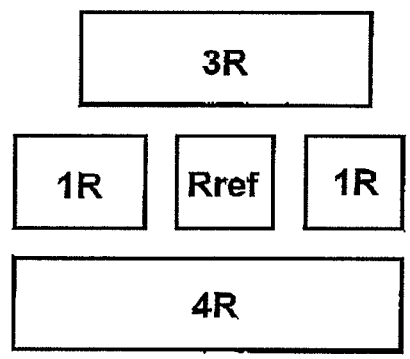
FIG. 4 is a diagram of Patent Literature 2.

FIG. 1 is referred to again to describe the configuration of the constant voltage output circuit using the voltage divider circuit.

The amplifier receives two input voltages from a reference voltage generating circuit and the voltage divider circuit, and operates so that the two voltages become the same. For example, when the reference voltage is 1.0 V and the division ratio of the voltage divider circuit is 1:1, the output voltage of the constant voltage output circuit is 2.0V. If required accuracy of the output voltage of the constant voltage output circuit is ±1%, the output voltage needs to fall within a range of ±1%, specifically, a range of from 1.98 V to 2.02 V. It is assumed here that the reference voltage varies by ±80 mV, that is, ±8% due to the manufacturing variation. In this case, the division ratio of the voltage divider circuit needs to be adjusted within a range of ±8% or more with a pitch of less than 1%, provided that the reference is 1:1.

Figure 5:
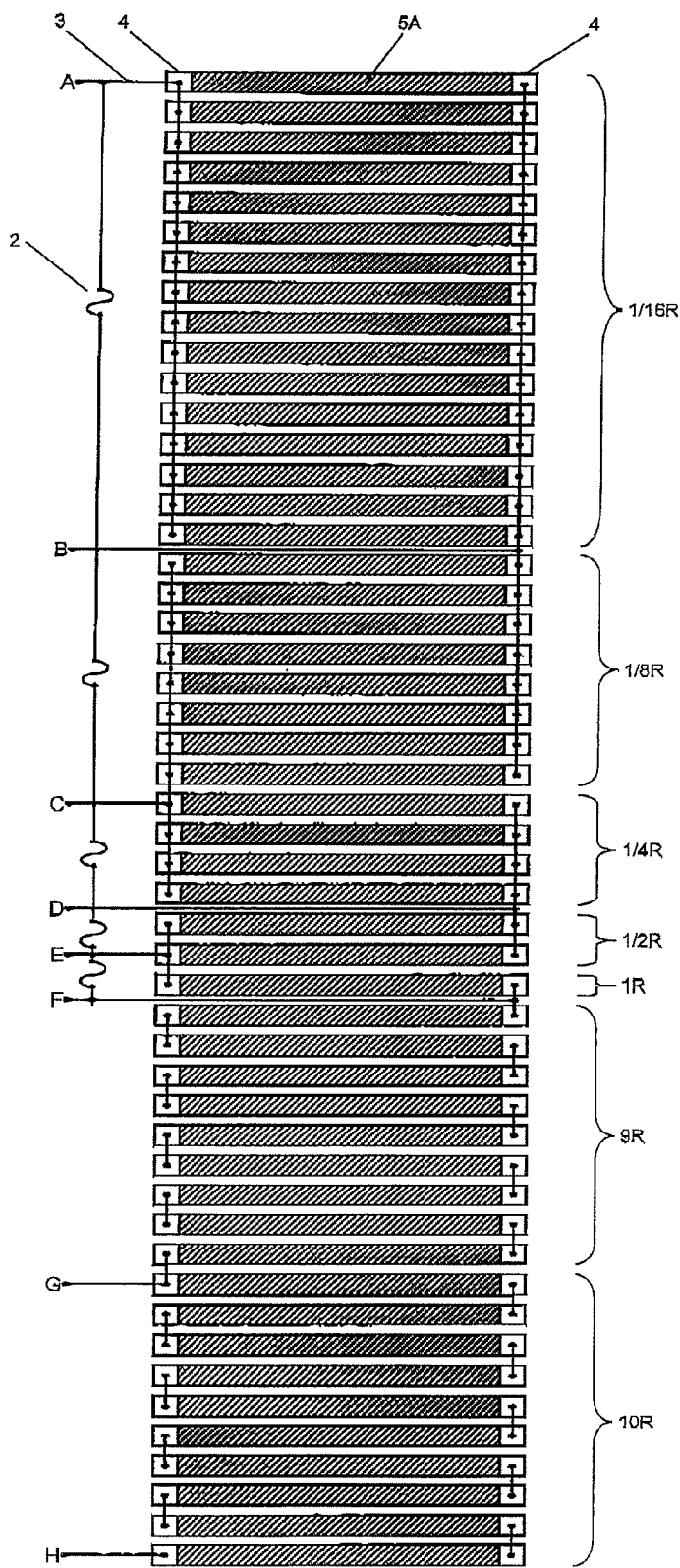
FIG. 5 is a diagram illustrating a related-art voltage divider circuit.

An example of a voltage divider circuit capable of realizing this adjustment is illustrated in FIG. 5.

1R is a unit resistor, and 1/16R, 1/8R, 1/4R, 1/2R, 1R, 9R, and 10R are connected in series. In this case, 1/16R includes sixteen 1R connected in parallel to each other, and 10R includes ten 1R connected in series. The same holds true for others.

A plurality of fuses is connected in parallel to the respective resistors 1/16R, 1/8R, 1/4R, 1/2R, and 1R. In other words, the plurality of fuses is respectively arranged correspondingly to the plurality of resistors, and respectively controls the plurality of resistors to be selected or not to be selected through cutting and short circuiting of the fuse. Terminals arranged between the resistors are referred to as "terminal A", "terminal B", . . . , "terminal G", and "terminal H" in order. The terminal A is connected to an output terminal of the constant voltage output circuit, the terminal G is connected to an input terminal of the amplifier, and the terminal H is connected to a ground terminal.

Through the cutting (trimming) of the fuse, as shown in FIG. 6, the division ratio of the voltage divider circuit can be adjusted within a range of from −9.4% to +10% with a pitch of 0.625%, provided that the reference is 1:1.

An optimal ratio of resistance values of 1/16R, 1/8R, 1/4R, 1/2R, 1R, 9R, and 10R is 1/16:1/8:1/4:1/2:1:9:10. However, an actual ratio of the resistance values deviates from the optimal ratio. Accuracy of the ratio of the resistance values of the resistors is referred to as "accuracy of ratio".

FIG. 5 illustrates the voltage divider circuit with a pitch of 0.625%, and hence the accuracy of the division ratio needs to be 0.375% or less in order to realize the accuracy of ±1% of the voltage divider circuit. The accuracy of the division ratio is a matching degree of a division ratio supposed to be achieved through fuse trimming and an actually achieved division ratio. It is desired that the accuracy of the division ratio be ±0.2% or less so that a little margin is ensured.

In a case where the resistance value of each of the resistors is Ra, the resistance value of the resistor arranged between G and H is Rgh, and the accuracy of the division ratio is 0.2%, as shown in FIG. 7, required accuracy of ratio X required for each of the resistors is calculated by the following expression.

$$X(\%) = 0.2 \times Rgh/Ra$$

As shown in the above-mentioned expression and FIG. 7, the required accuracy of ratio X is different for each of the resistors. Required accuracy of ratio for a resistor having a small resistance value is significantly low. For example, in Example 1 of FIG. 6 in which all of the fuses are cut, the resistance value of the resistor arranged between A and G is 10.9375R, the resistance value of the resistor arranged between G and H is 10R, and the division ratio is 1.094. Even when the resistor 1/16R having the smallest resistance value deviates by 32% and the resistance value of 1/16R shifts from 0.06250R to 0.08250R, the resistance value of the resistor arranged between A and G only shifts from 10.9375R to 10.9575R. Accordingly, the division ratio shifts from 1.094 to 1.096, that is, shifts only by 0.2%. In other words, the resistor 10R having a large resistance value can deviate only by 0.2%, but the resistor 1/16R having the small resistance value may deviate by 32%.

In the voltage divider circuit of FIG. 5, each of the resistors includes the unit resistors connected in series or connected in parallel to each other, and hence the area of 1/16R is 1.6 times as large as that of 10R. The large area lessens the influence of a local variation to improve the accuracy of ratio. It is generally considered that the local variation has a normal distribution, and its standard deviation σ is inversely proportional to the square root of the area. The standard deviation σ means a width of the variation. Thus, a resistor, which has an area 1.6 times as large as that of a resistor for comparison, has the width of variation $1/\sqrt{(1.6)}=0.79$ times as small as that of the resistor for comparison. However, the ratio accuracy required for 1/16R is 32% as described above. This corresponds to a value 160 times as large as 0.2% for 10R. It is considered based on the calculation that the required accuracy of ratio is satisfied when 1/16R has the area $1/\sqrt{(160)}=1/12.6$ times as small as that of 10R. Thus, it is meaningless to use 1/16R having such a large area in terms of the required accuracy of ratio.

Figure 8:
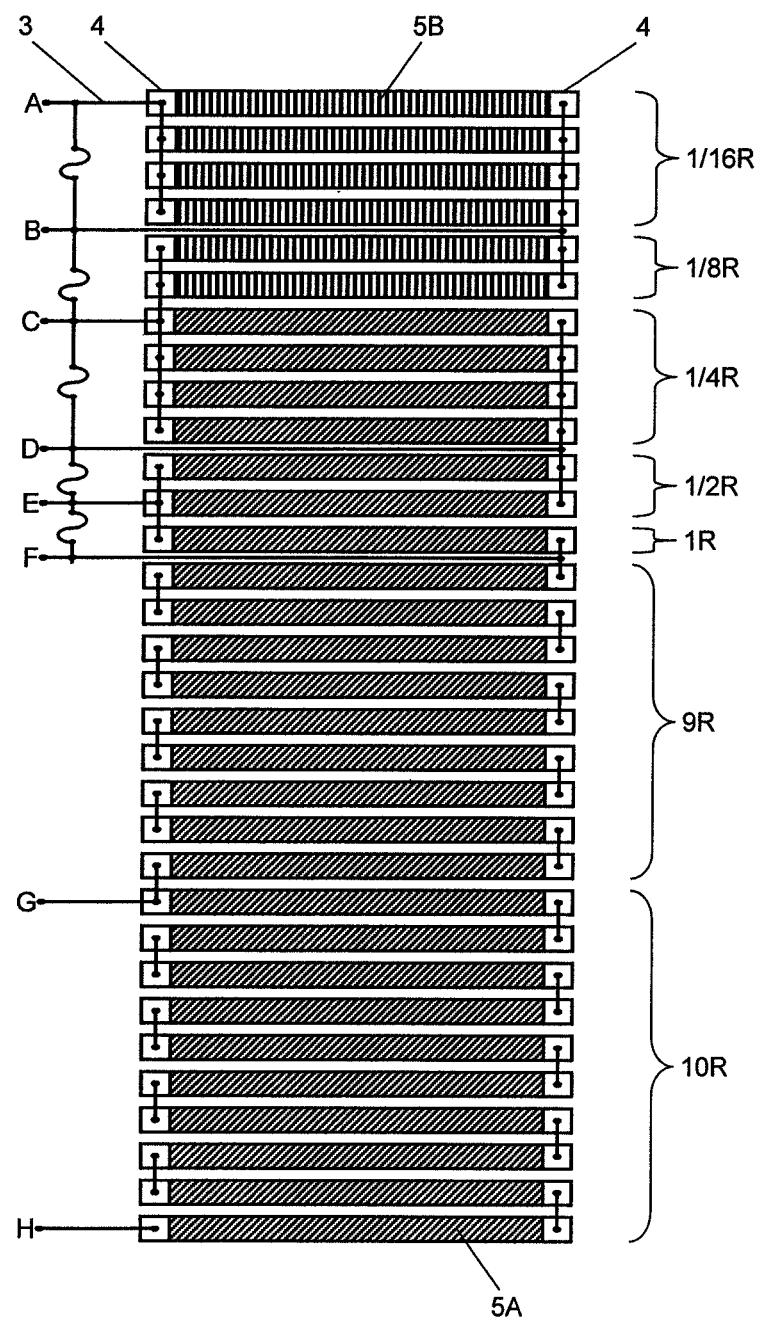
FIG. 8 is a diagram illustrating a voltage divider circuit.

For this reason, the present invention includes two unit resistors as illustrated in FIG. 8. The two unit resistors are referred to as "first unit resistor 5A" and "second unit resistor 5B", respectively. In this example, a resistance value of the second unit resistor is one fourth of a resistance value of the first unit resistor. Each of 1/8R and 1/16R having the low resistance value includes the second unit resistors 5B connected in parallel to each other. Each of the other resistors includes the first unit resistors 5A connected in parallel to each other or connected in series. The resistors are divided into groups, four in the 1/16R group, two in the 1/8R group, and so on as shown in FIG. 8, and each group of resistors is connected in parallel to a short circuit control element such as a fuse 2.

The ratio of the resistance values of the first unit resistor and the second unit resistor varies due to the manufacturing variation, but a first unit resistor and a second unit resistor having the variation of 10% or less can be used. It is assumed here that the ratio of the resistance values of the first unit resistor 5A and the second unit resistor 5B deviates from a supposed ratio by 10%. As described above, the required accuracy of ratio for 1/8R and 1/16R is larger (worse) than 10%. Thus, even when each of 1/8R and 1/16R having the low resistance value includes the second unit resistors 5B connected in parallel to each other, and each of the other resistors includes the first unit resistors 5A, the accuracy of the division ratio of the voltage divider circuit can satisfy 0.2%. In this case, each of 1/8R and 1/16R includes the second unit resistor having the low resistance value, and hence the areas of 1/8R and 1/16R are small.

That is, the accuracy of ratio deviates among the unit resistors when a plurality of kinds of unit resistors is used. However, if the required accuracy of ratio for the resistors is larger (worse) than the deviation, each of those resistors can include different unit resistors to reduce the area. Further, if the required accuracy of ratio for the resistors is finer (better) than the deviation, each of those resistors includes one unit resistor as in the related art.

In other words, among the plurality of resistors of the voltage divider circuit, each of the resistors 1/4R, 1/2R, 1R, 9R, and 10R having the high required accuracy of ratio may include the first unit resistors 5A that have the first resistance values and are connected in series or connected in parallel to each other, and each of the resistors 1/8R and 1/16R having the low required accuracy of ratio may include the second unit resistors 5B that have the second resistance values and are connected in series or connected in parallel to each other in some cases. In this case, the second resistance value is lower than the first resistance value.

Note that, the smallest resistor is 1/16R (0.0625R) in the case where the required accuracy of the output voltage of the constant voltage output circuit is +1%, but the smallest resistor is 1/32R (0.03125R) in the case where the required accuracy is +0.5%. When the voltage divider circuit only includes one unit resistor as in the related art, the area of 1/32R significantly increases. The present invention exhibits a greater effect if the present invention is applied to such a case.

In the example described above, the ratio of the resistance values of the first unit resistor 5A and the second unit resistor 5B is 4:1, but the present invention is not limited thereto.

Further, two kinds of unit resistors are used in the above description, but the present invention is not limited thereto. A third unit resistor forming 1/8R may be used besides the second unit resistor forming 1/4R.

Further, the ratio of the resistance values of the plurality of kinds of unit resistors is not necessarily limited to a multiple of 1:2. As long as the resistance value of the second unit resistor is smaller than the resistance value of the first unit resistor, the effect of the present invention can be obtained.

Further, the present invention is not limited to the case where the division ratio of the voltage divider circuit has one target value. In a case where a plurality of target values exists, resistors are added depending on the target values. In this case the output voltages can be realized only by trimming resulting in low cost of the product, for example, if the market requires various output voltages of the constant voltage output circuit.

Figure 9:
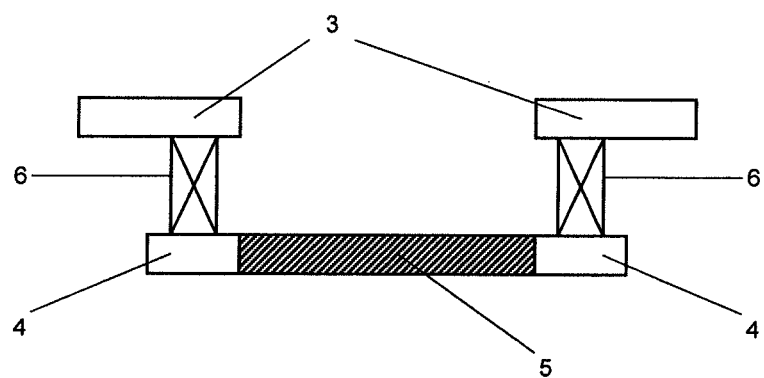
FIG. 9 is a cross-sectional view of a resistor.

FIG. 9 illustrates a cross-sectional view of the resistor forming the voltage divider circuit. A resistive element includes a resistance region 5 and low resistance regions 4. The low resistance region 4 and a wire 3 are connected with each other via a contact 6.

Figure 10:
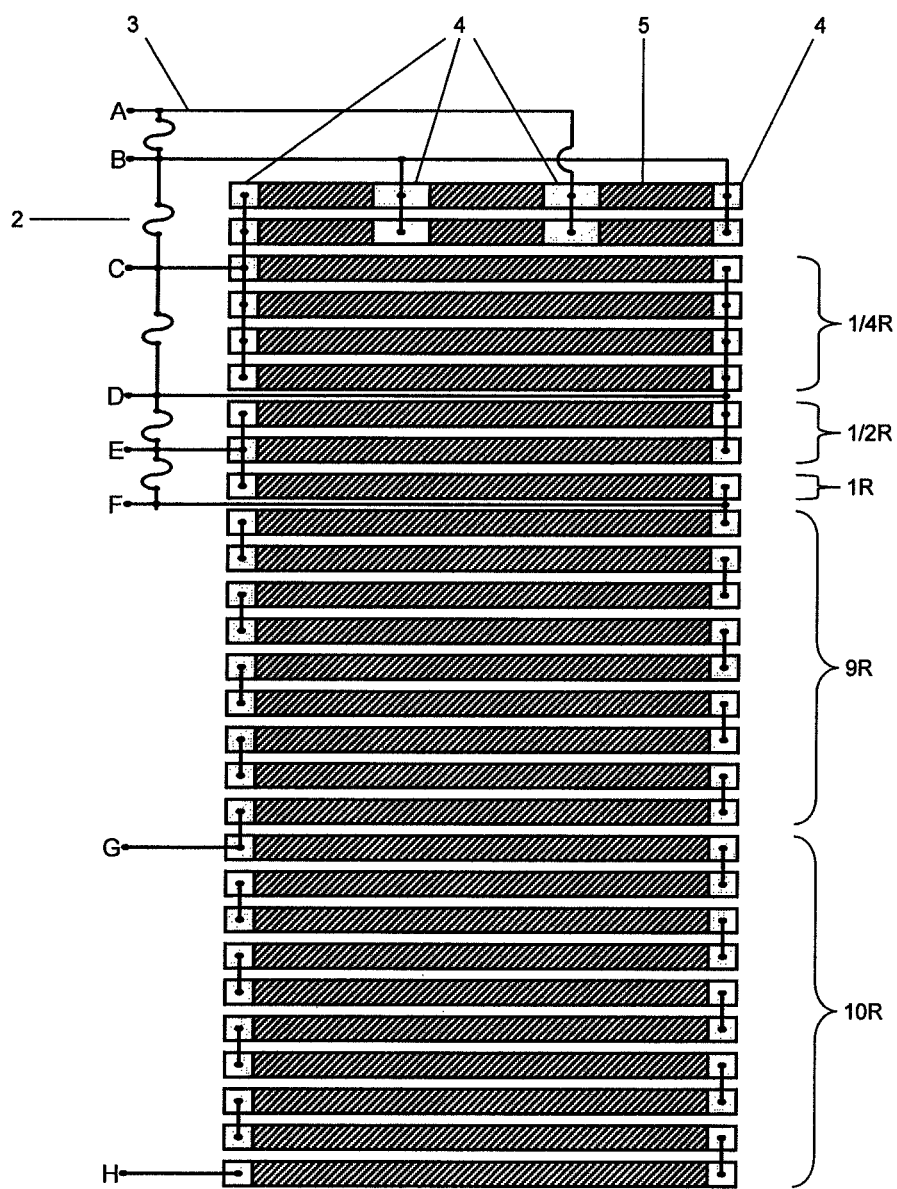
FIG. 10 is a diagram illustrating a voltage divider circuit.

FIG. 10 illustrates the first unit resistor and the second unit resistor each of which includes the low resistance regions made of the same material having the same sheet resistance. The resistance value is expressed by sheet resistance×length/width, and the first unit resistor and the second unit resistor are different in length or width, or in both length and width. In the semiconductor manufacturing process, when two kinds of sheet resistance materials are used, accuracy of a ratio of resistance values of the two kinds of sheet resistances is poor (significantly varies). However, the length and the width are determined through a photoetching process, and hence accuracy of a ratio of the length and the width is better than the accuracy of the ratio of the resistance values of the two kinds of sheet resistances. Thus, in a case where each of the first unit resistor and the second unit resistor includes the low resistance regions made of the same material having the same sheet resistance, and the difference in resistance value is due to the difference in length or width, the accuracy of the ratio of the resistance values of the first unit resistor and the second unit resistor is improved. When the accuracy of the ratio of the resistance values of the first unit resistor and the second unit resistor is good, the second unit resistor can form a resistor having a larger resistance value. This means that the voltage divider circuit is reduced in size, which leads to the reduction in manufacturing cost.

Further, the length of the resistor is set larger than the width in order to increase the resistance value, and hence the accuracy of the ratio of the lengths is better than the accuracy of the ratio of the widths. Thus, in a case where each of the first unit resistor and the second unit resistor includes the low resistance regions made of the same material having the same sheet resistance, and the second unit resistor and the first unit resistor are the same in width and different in length, the accuracy of the ratio of the resistance values of the first unit resistor and the second unit resistor is further improved.

The related-art resistor voltage divider circuit includes low resistance regions arranged at both ends of a resistive element as illustrated in FIG. 5. When the low resistance region is arranged on the resistive element forming the second unit resistor at a position other than the both ends, the area of the voltage divider circuit can be reduced as illustrated in FIG. 10.

Each of upper two resistive elements of FIG. 10 includes four low resistance regions and three second unit resistors. The related-art resistor voltage divider circuit only includes one unit resistor in one resistive element as illustrated in FIG. 5. Thus, according to the invention of the subject application, it is possible to set the area of the voltage divider circuit to be smaller than that in the related art. In this example, one resistive element includes the three second resistors, but the number of three has no meaning. As long as one resistive element includes three or more low resistance regions, and two or more second unit resistors share the one resistive element, the area of the voltage divider circuit becomes smaller than that in the related art.

When all of the resistive elements of FIG. 10 have the same size, the variation in shape of the resistive elements is small to improve the accuracy of ratio. Because the resistive elements have the same size, the first unit resistor and the second unit resistor are the same in sheet resistance and width, and different in length. The position of the low resistance region is adjusted so that the resistance value of the second unit resistor becomes one fourth of the resistance value of the first unit resistor. Then, 1/16R is arranged between A and B, and 1/8R is arranged between B and C.

In the related art, as illustrated in FIG. 5, the low resistance region is connected to the short circuit control element by wiring from only two sides of the resistive element in a long side direction. When the low resistance region is connected to the short circuit control element by wiring also from a short side direction of the resistive element as illustrated in FIG. 10, the area of the voltage divider circuit is reduced.

Figure 11:
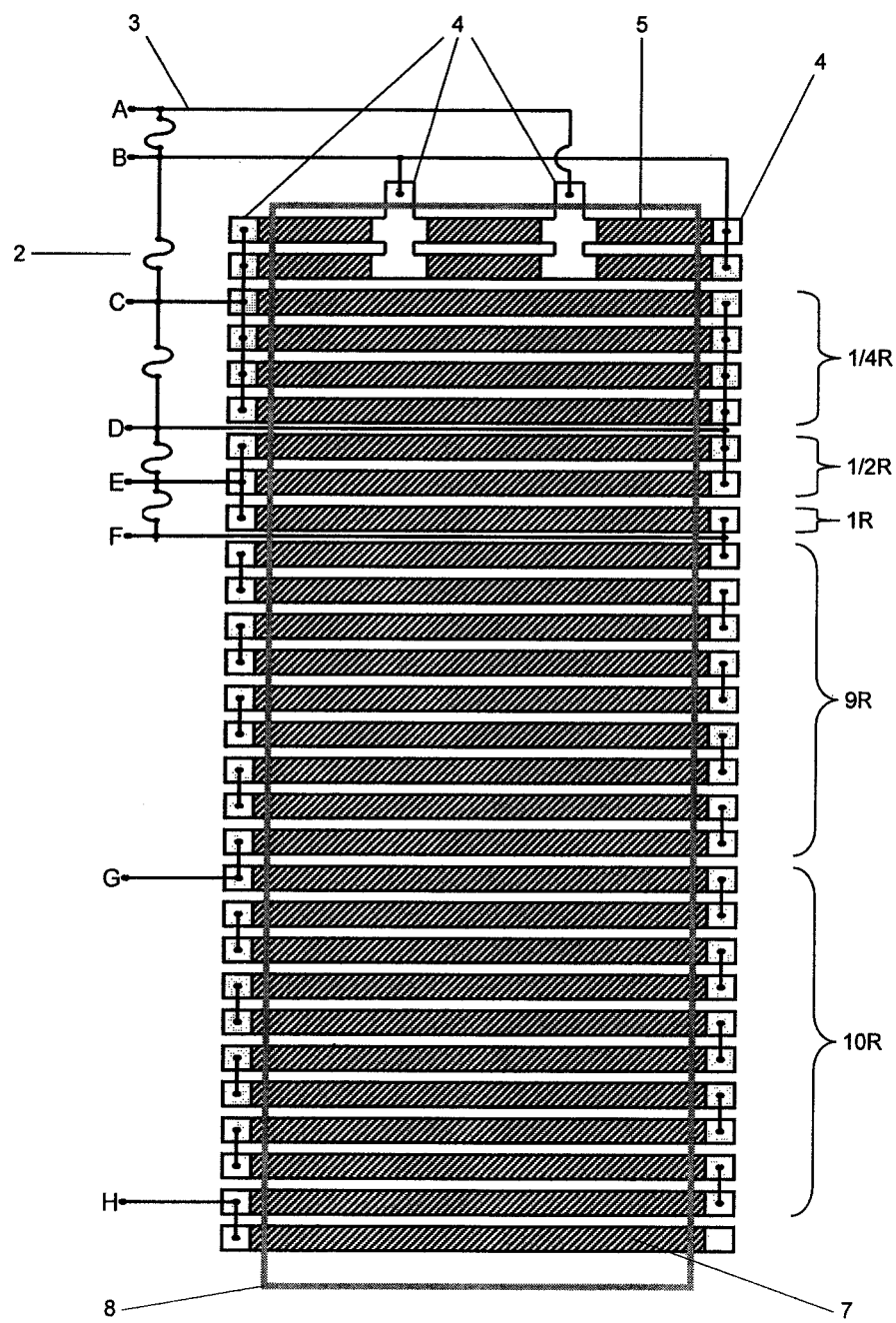
FIG. 11 is a diagram illustrating a voltage divider circuit.

Further, in order to improve the accuracy of the division ratio of the voltage divider circuit, a metal layer serving as a cover 8 is arranged on the resistance regions. As illustrated in FIG. 11, when the low resistance regions 4 are connected to each other, it is unnecessary to extend the wiring of the metal layer on the low resistance regions 4, and hence the cover 8 covering all of the resistance regions can be arranged.

Further, the accuracy of ratio is improved when dummy resistors having no electrical functions are arranged at the outer sides of the resistors arranged at both ends of the voltage divider circuit. This is because the resistive elements arranged at the both ends easily lose their shapes. For example, the required accuracy of ratio for 10R arranged between G and H is high, and hence, as illustrated in FIG. 11, a dummy resistor 7 is arranged at the bottom (the end of the voltage divider circuit) of FIG. 11 so that the accuracy of ratio is improved. Note that, the required accuracy of ratio for 1/16R arranged on the opposite side is low to allow for the variation, and the dummy resistor is thus unnecessary. In other words, 1/16R also functions as the dummy resistor. Then, the area is reduced.

Further, when resistive elements having different shapes are adjacent to each other, the resistive elements easily lose their shapes. Then, the dummy resistor having no electrical function is interposed between the resistive elements having the different shapes so that the accuracy of ratio is improved. The upper two resistors have different shapes in FIG. 11, and hence the dummy resistor is interposed between a second resistor and a third resistor counted from the top so that the accuracy of ratio is improved.

In the semiconductor wafer process, the relative ratio of the unit resistors is good around the center of the voltage divider circuit, and poor at the end. Thus, the accuracy of the division ratio is good when the resistor including the unit resistor having the high resistance value (the resistor having the high required accuracy of ratio) is arranged around the center of the voltage divider circuit, and the resistor including the unit resistor having the low resistance value (the resistor having the low required accuracy of ratio) is arranged at the end. In the example of FIG. 8, both of 1/8R and 1/16R having the low required accuracy of ratio are arranged at the same end of the voltage divider circuit, but the accuracy of the division ratio is improved when 1/16R is moved to the end on the opposite side.

Further, a polycrystalline polysilicon film is often used for the resistive element of the resistor voltage divider circuit. The first unit resistor and the second unit resistor are formed of the same polycrystalline polysilicon film. The impurity concentration in the polycrystalline polysilicon film of the second unit resistor is higher than that of the first unit resistor. A sheet resistance of the polycrystalline polysilicon film can be adjusted by adjusting the impurity concentration in the film. Accuracy of a ratio of sheet resistances of two resistors that are formed of the same polycrystalline polysilicon film and have different impurity concentrations is better than accuracy of a ratio of sheet resistances of two resistors formed of different films. When the sheet resistance is changed, the ratio of the resistance values of the first unit resistor and the second unit resistor can significantly differ from each other. Thus, a plurality of unit resistors having the resistance values significantly different from each other, and relatively good accuracy of the resistance values can be obtained.

REFERENCE SIGNS LIST 1 resistor
2 trimming fuse
3 wire
4 low resistance region
5 resistance region
5A resistance region (first unit resistor)
5B resistance region (second unit resistor)
6 contact
7 dummy resistor
8 cover

The invention claimed is:

1. A voltage divider circuit, comprising:
a plurality of resistors connected in series; and
a plurality of short circuit control elements respectively connected in parallel to the plurality of resistors and configured to respectively control selection or non-selection of the resistors, the plurality of resistors comprising:
  a first resistor including a first unit resistor having a first resistance value, the first resistor including one or more first unit resistors connected in series or in parallel; and
  a second resistor including a second unit resistor having a second resistance value, the second resistor including second unit resistors connected in parallel or in series,
the second resistance value being smaller than the first resistance value.

2. The voltage divider circuit according to claim 1, wherein each of the first unit resistor and the second unit resistor comprises a resistance region and a low resistance region arranged at each end of the resistance region, the resistance regions of the first unit resistor and the second unit resistor being arranged on resistive elements different from each other, and
  wherein the resistance regions of the first unit resistor and the second unit resistor are made of the same material having the same sheet resistance.

3. The voltage divider circuit according to claim 2, wherein a width of the resistive element of the second unit resistor is the same as a width of the resistive element of the first unit resistor, and a length of the resistance region of the second unit resistor is different from a length of the resistance region of the first unit resistor.

4. The voltage divider circuit according to claim 3, wherein the second unit resistor comprises the low resistance region arranged at a position other than an end of the resistive element.

5. The voltage divider circuit according to claim 2, wherein the resistive element comprises three or more of the low resistance regions, and
wherein two or more of the second unit resistors share the one resistive element.

6. The voltage divider circuit according to claim 2, wherein the second unit resistor comprises a first low resistance region arranged at a position other than an end of the resistive element, the second unit resistor being electrically connected to a second low resistance region of an adjacent second unit resistor, and being connected to a corresponding one of the plurality of short circuit control elements by wiring also from a short side direction of the resistive element.

7. The voltage divider circuit according to claim 6, wherein the second unit resistor is connected to the second low resistance region of the adjacent second unit resistor with use of the same material as a material of the first low resistance region.

8. The voltage divider circuit according to claim 1, wherein the second unit resistor is arranged at an end of the plurality of resistors, and a part of the second unit resistor functions also as a dummy resistor.

9. The voltage divider circuit according to claim 1, further comprising a dummy resistor arranged between a resistive element forming the first unit resistor and a resistive element forming the second unit resistor.

10. The voltage divider circuit according to claim 1, wherein the first unit resistor is arranged around a center of the plurality of resistors, and the second unit resistor is arranged at an end of the plurality of resistors.

11. The voltage divider circuit according to claim 1,
wherein the first unit resistor and the second unit resistor comprise the same polycrystalline polysilicon film, and
wherein an impurity concentration in the polycrystalline polysilicon film of the second unit resistor is higher than an impurity concentration of the polycrystalline polysilicon film of the first unit resistor.

12. A voltage divider circuit, comprising:
a plurality of resistors connected in series and divided into groups; and
fuses each connected in parallel to a respective one of the groups of said plurality of resistors, each group of said plurality of resistors comprising one or both of:
a first resistor including a first unit resistor having a first resistance value, the first resistor including one or more first unit resistors connected in series or in parallel; and
a second resistor including a second unit resistor having a second resistance value, the second resistor including second unit resistors connected in parallel or in series,
the second resistance value being smaller than the first resistance value.

13. The voltage divider circuit according to claim 12, wherein each of the first unit resistor and the second unit resistor comprises a resistance region and a low resistance region arranged at each end of the resistance region, the resistance regions of the first unit resistor and the second unit resistor being arranged on resistive elements different from each other, and
wherein the resistance regions of the first unit resistor and the second unit resistor are made of the same material having the same sheet resistance.

14. The voltage divider circuit according to claim 13, wherein a width of the resistive element of the second unit resistor is the same as a width of the resistive element of the first unit resistor, and a length of the resistance region of the second unit resistor is different from a length of the resistance region of the first unit resistor.

15. The voltage divider circuit according to claim 14, wherein the second unit resistor comprises the low resistance region arranged at a position other than an end of the resistive element.

16. The voltage divider circuit according to claim 13,
wherein the resistive element comprises three or more of the low resistance regions, and
wherein two or more of the second unit resistors share the one resistive element.

17. The voltage divider circuit according to claim 12, wherein the second unit resistor comprises a first low resistance region arranged at a position other than an end of the resistive element, the second unit resistor being electrically connected to a second low resistance region of an adjacent second unit resistor, and being connected to a corresponding one of the fuses by wiring also from a short side direction of the resistive element.

18. The voltage divider circuit according to claim 12, further comprising a dummy resistor arranged between a resistive element forming the first unit resistor and a resistive element forming the second unit resistor.

19. The voltage divider circuit according to claim 12, wherein the first unit resistor is arranged around a center of the plurality of resistors, and the second unit resistor is arranged at an end of the plurality of resistors.

20. The voltage divider circuit according to claim 12,
wherein the first unit resistor and the second unit resistor comprise the same polycrystalline polysilicon film, and
wherein an impurity concentration in the polycrystalline polysilicon film of the second unit resistor is higher than an impurity concentration of the polycrystalline polysilicon film of the first unit resistor.

* * * * *